United States Patent
Wu

(10) Patent No.: US 9,213,330 B2
(45) Date of Patent: Dec. 15, 2015

(54) POSITION ADJUSTING SYSTEM AND METHOD

(71) Applicant: HON HAI PRECISION INDUSTRY CO., LTD., New Taipei (TW)

(72) Inventor: Cheng-Shiun Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 208 days.

(21) Appl. No.: 14/060,620

(22) Filed: Oct. 23, 2013

(65) Prior Publication Data

US 2015/0012135 A1 Jan. 8, 2015

(30) Foreign Application Priority Data

Jul. 4, 2013 (TW) .............................. 102123921 A

(51) Int. Cl.
*G05B 15/00* (2006.01)
*G05B 19/00* (2006.01)
*G05B 19/402* (2006.01)
*B25J 9/16* (2006.01)
*H01L 23/00* (2006.01)

(52) U.S. Cl.
CPC ............. *G05B 19/402* (2013.01); *B25J 9/1687* (2013.01); *B25J 9/1697* (2013.01); *H01L 24/75* (2013.01); *G05B 2219/39* (2013.01); *H01L 2224/75753* (2013.01); *H01L 2224/75901* (2013.01); *Y10T 29/41* (2015.01)

(58) Field of Classification Search
CPC . G05B 19/402; G05B 2219/39; B25J 9/1697; B25J 9/1687; H01L 24/75; H01L 2224/75753; H01L 2224/75901; Y10T 29/41
USPC ............... 700/245–259; 348/87, 94; 29/25.01
See application file for complete search history.

(56) References Cited

U.S. PATENT DOCUMENTS

| | | | | |
|---|---|---|---|---|
| 6,141,863 | A | * | 11/2000 | Hara et al. ..................... 29/714 |
| 2003/0091409 | A1 | * | 5/2003 | Danna et al. .................. 414/217 |
| 2013/0283579 | A1 | * | 10/2013 | Tseng ......................... 29/25.01 |

* cited by examiner

*Primary Examiner* — Jason Holloway
*Assistant Examiner* — Rachid Bendidi
(74) *Attorney, Agent, or Firm* — Novak Druce Connolly Bove + Quigg LLP

(57) ABSTRACT

A position adjusting device includes a movable mechanical arm, suction, an adjusting mechanism, a bottom plate, a first camera, a second camera, and a processor. The processor controls the movable mechanism arm and the suction to move to a top of the first camera in response to a user operation, switches the first camera from a disabled state to the enabled state, acquires the first image captured by the first camera, and calculates a first angle between the first image and a first predetermined image. The processor adjusts the position of a second element based on the first angle and acquires a second angle between a second image of the second element and a second predetermined image. The processor adjusts the position of the second element until the first angle is the same as the second angle when the first angle is not the same as the second angle.

9 Claims, 10 Drawing Sheets

POSITION ADJUSTING SYSTEM AND METHOD

BACKGROUND

1. Technical Field

The present disclosure relates to position adjusting devices, and particularly to a position adjusting system and a method running in a position adjusting device.

2. Description of Related Art

In certain situations, two different elements need to be aligned visually before installing one element on the other. However, the above method is not appropriate if the first element and the second element have a small size.

Therefore, what is needed is a position adjusting system to overcome the above described limitations.

DETAILED DESCRIPTION

Figure 1:
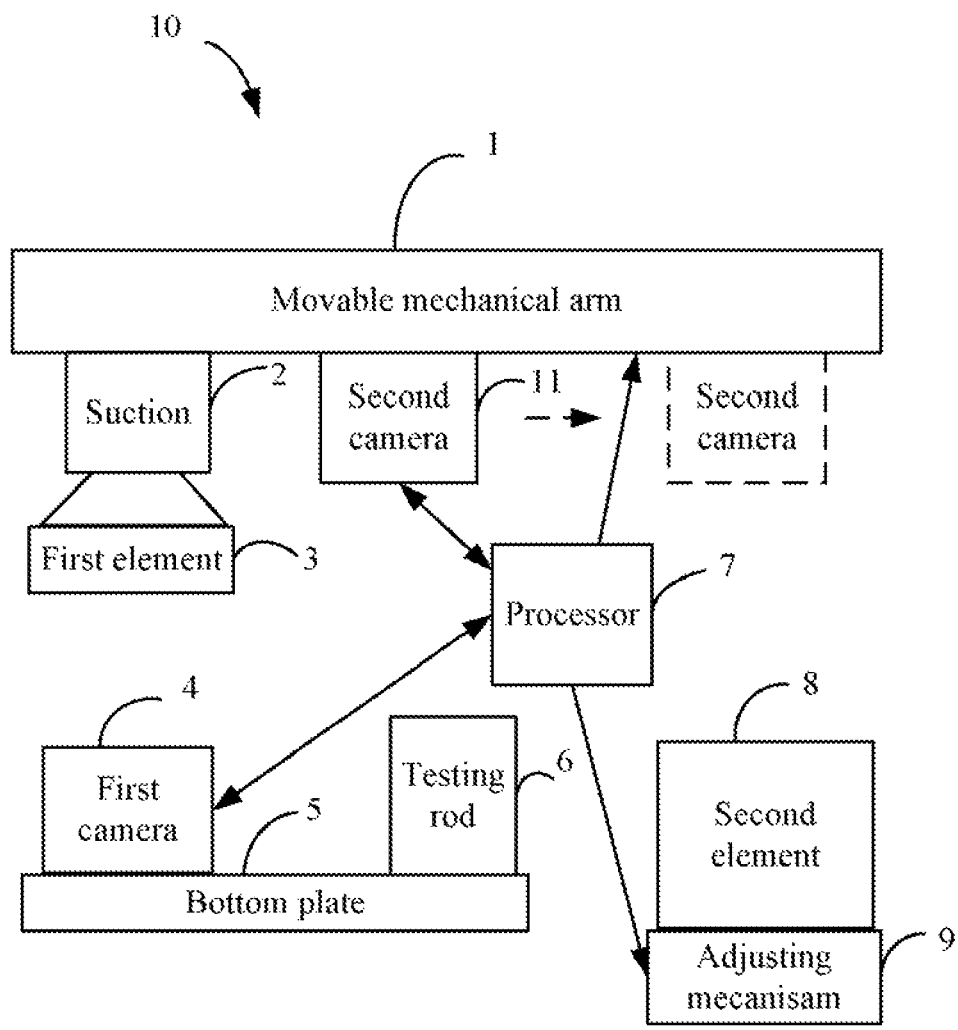
FIG. 1 is a block diagram of a position adjusting device in accordance with an exemplary embodiment.

FIG. 1 shows a position adjusting device 10. The position adjusting device 10 is used to adjust a position of a second element 8 based on a position of a first element 3. The position adjusting device 10 includes a movable mechanical arm 1, a suction 2 fixed on the mechanical arm 1, an adjusting mechanism 9 and a bottom plate 5 placed below the mechanical arm 1, a first camera 4 fixed on the bottom plate 5, a second camera 11 fixed on the mechanical arm 1, and a processor 7. The suction 2 is used to suck the first element 3. The adjusting mechanism 9 is used to support the second element 8.

The first camera 4 captures a first image of the first element 3 when the first camera 4 is in an enabled state. The second camera 11 captures a second image of the second element 8 when the second camera 11 is in an enabled state. In one embodiment, the first image of the first element 3 in FIG. 1 is defined as a first predetermined image. The second image of the second element 8 in FIG. 1 is defined as a second predetermined image.

Figure 2:
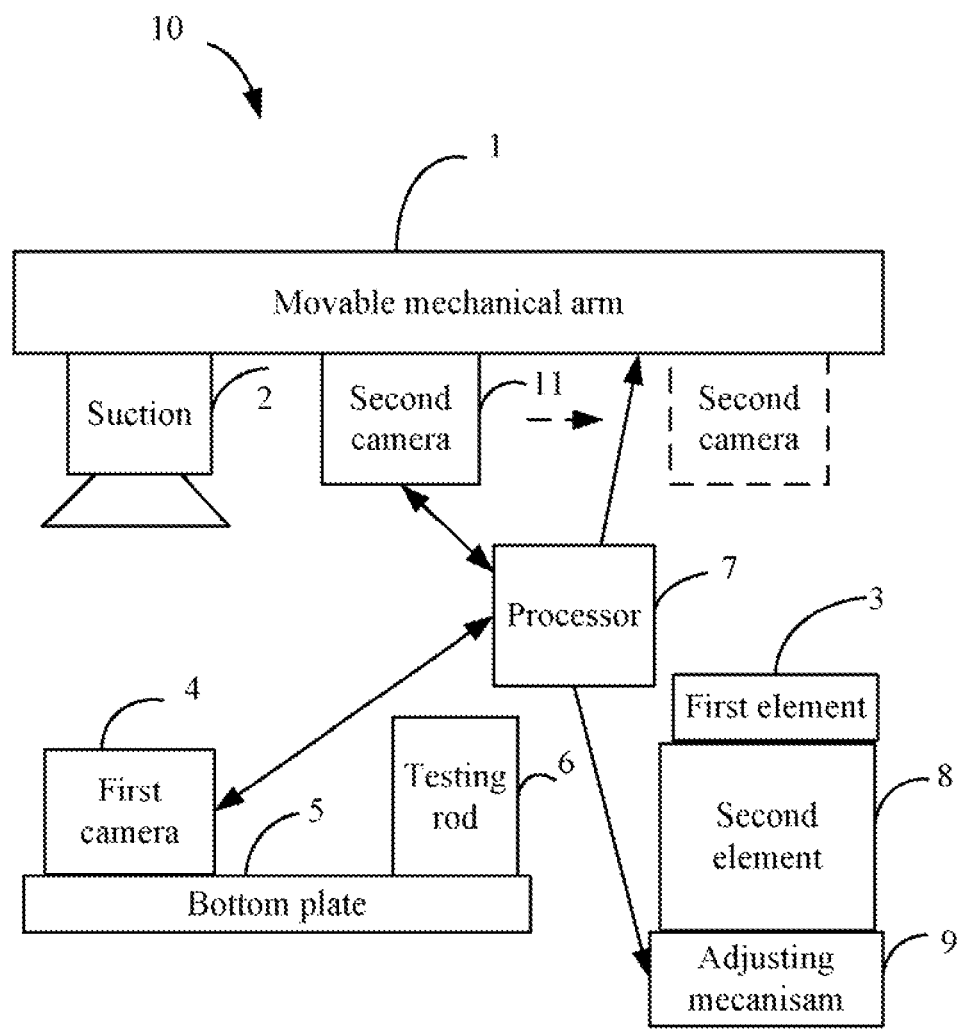
FIG. 2 shows that a first element is alignedly placed on a second element.

FIG. 2 shows that the first element 3 is aligndly placed on the second element 8.

Figure 3:
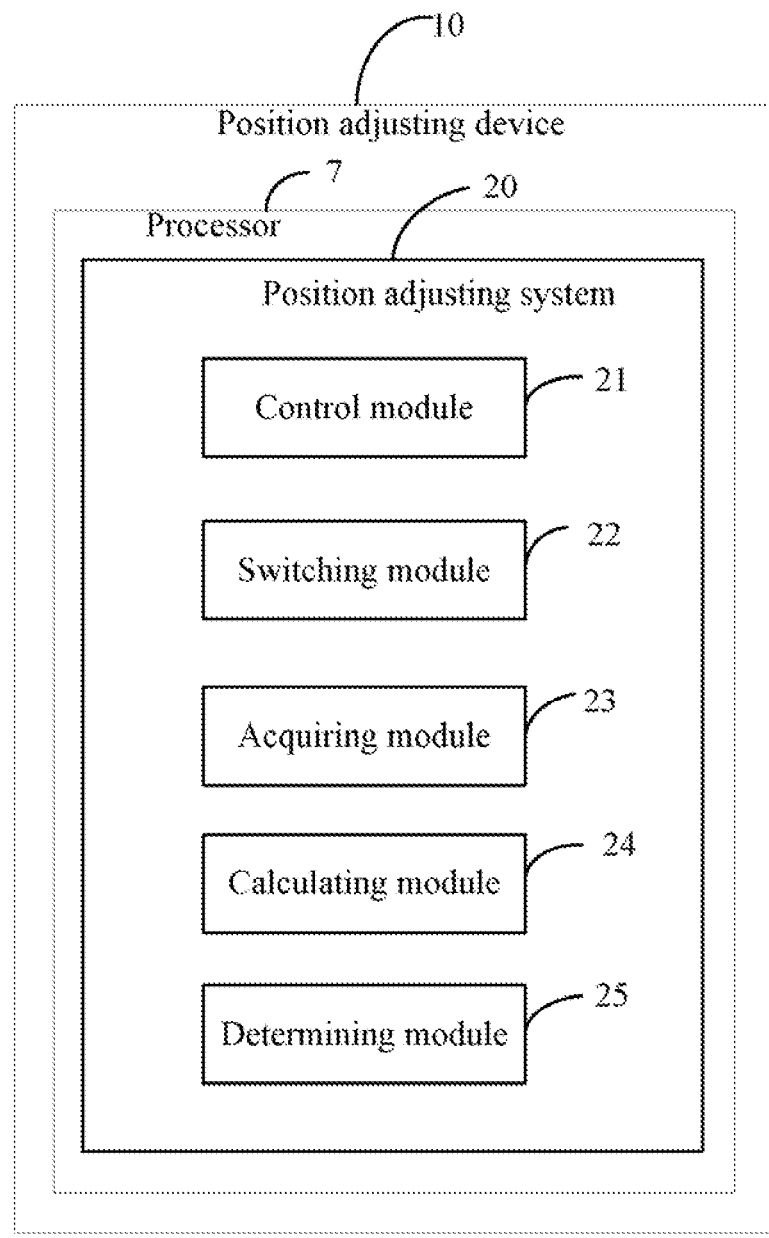
FIG. 3 is a block diagram of a position adjusting system in accordance with an exemplary embodiment.

FIG. 3 shows a position adjusting system 20 running in the position adjusting device 10. The position adjusting system 20 includes a control module 21, a switching module 22, an acquiring module 23, a calculating module 24, and a determining module 25 are collection of software instructions executed by the processor 7.

Figure 4:
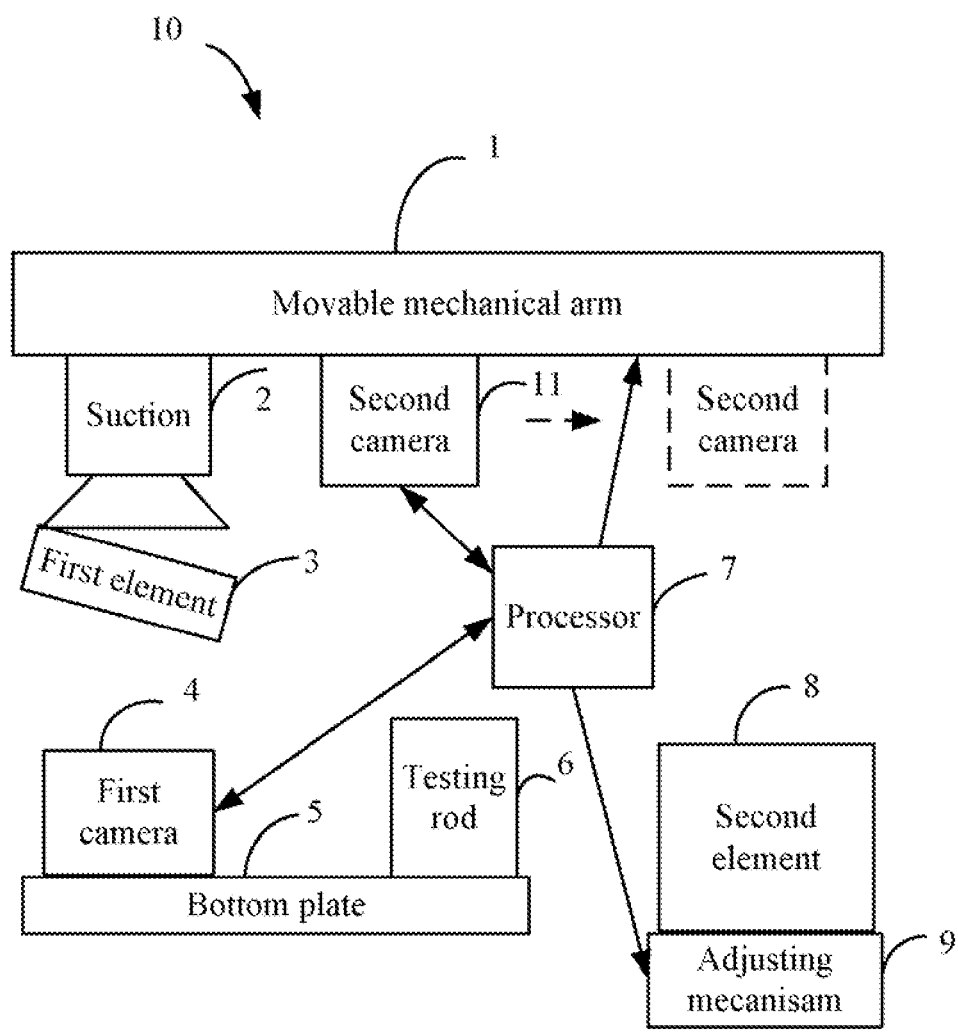
FIG. 4 shows that the first element is slantways sucked by suction.
Figure 5:
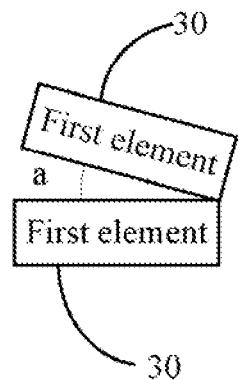
FIG. 5 shows a first angle between an image of the first element in FIG. 4 and an image of the first element in FIG. 1.
Figure 6:
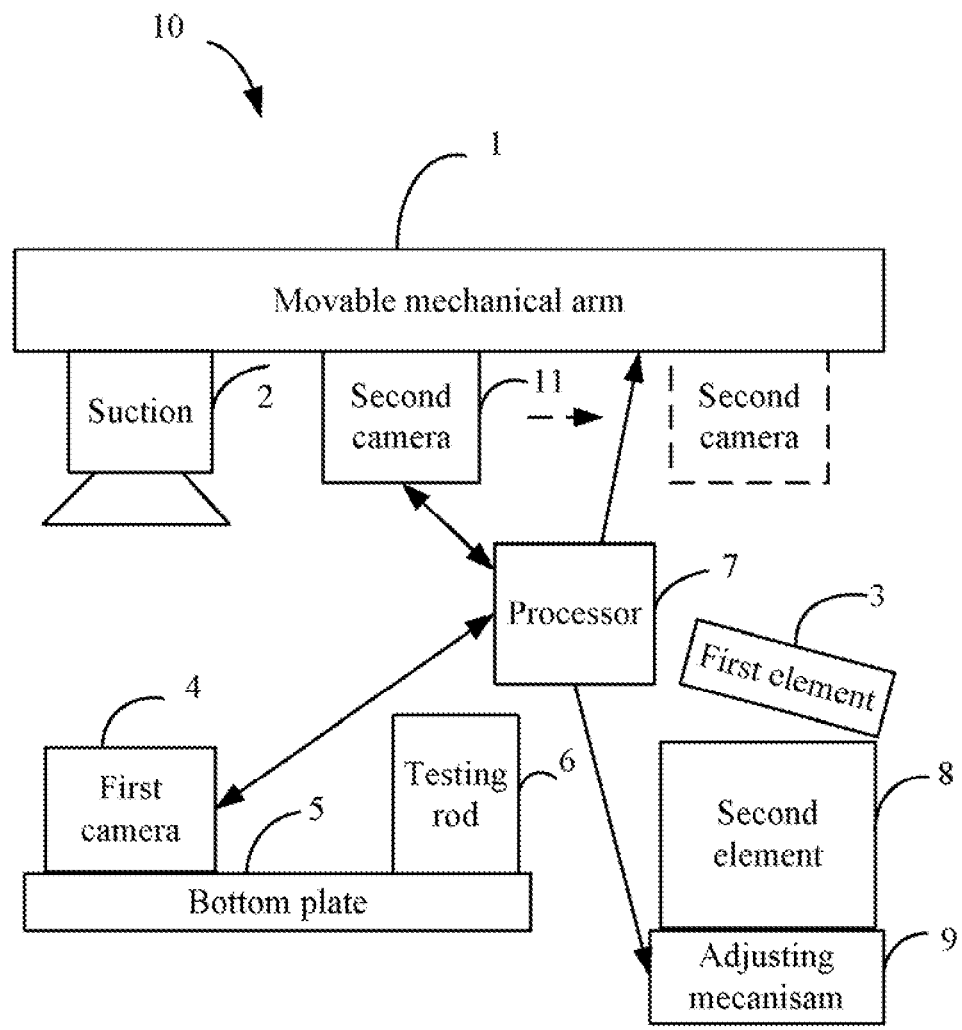
FIG. 6 shows that the first element is slantways placed on the second element.
Figure 7:
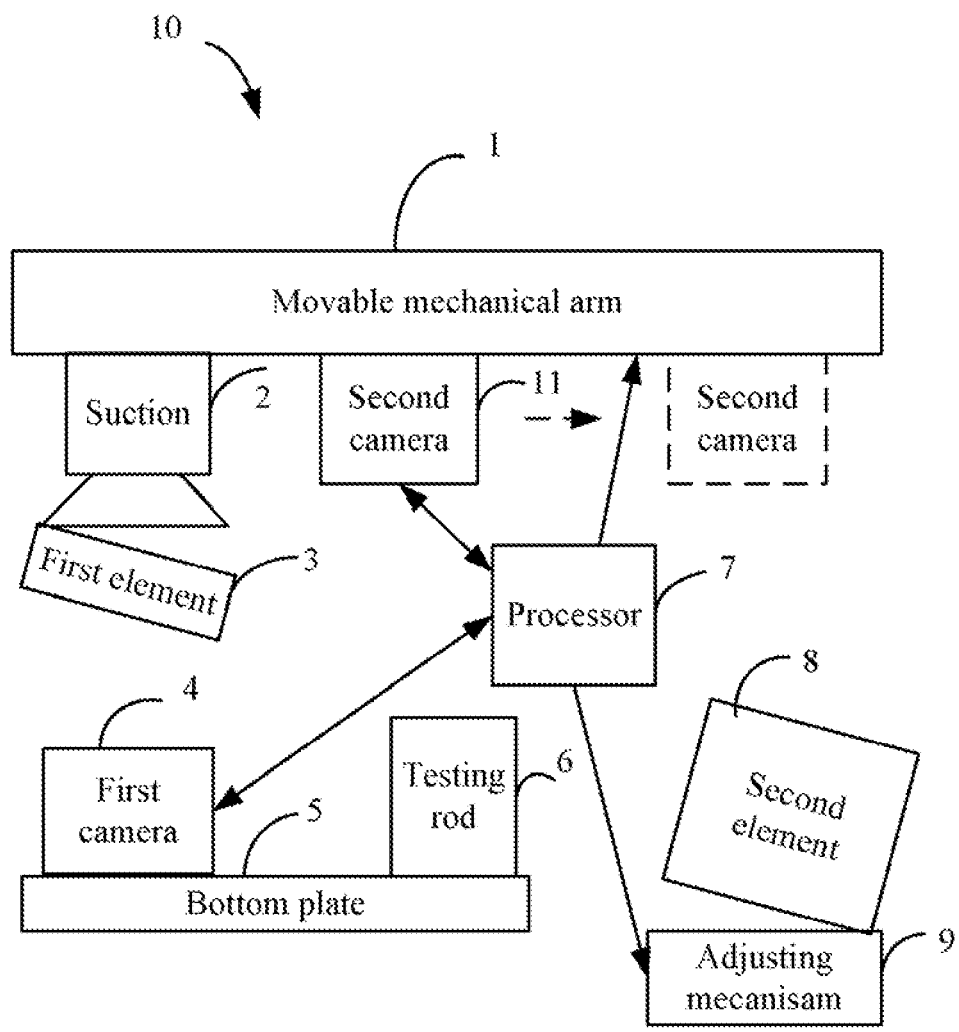
FIG. 7 shows that a position of the second element is adjusted based on the first angle.
Figure 8:
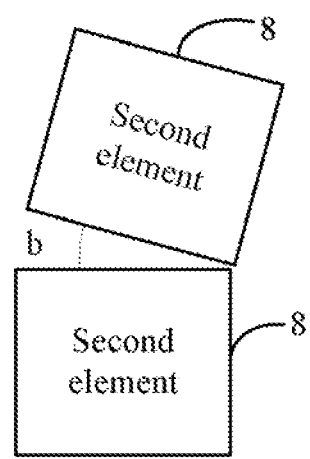
FIG. 8 shows that a second angle between an image of the second element in FIG. 1 and an image of the second image in FIG. 7.
Figure 9:
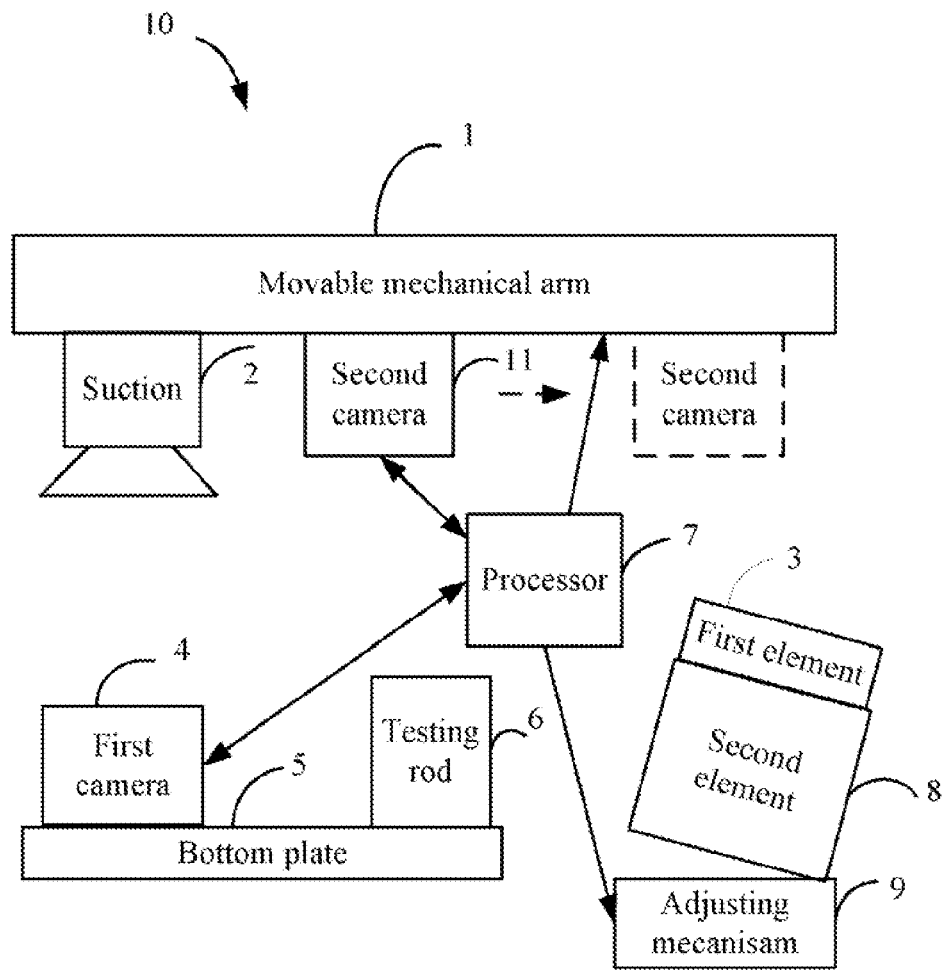
FIG. 9 shows that the first element is alignedly placed on the second element after the position of the second element has been adjusted.

The control module 21 controls the mechanism arm 1 and the suction 2 to move to a top of the first camera 4 in response to a user operation. The switching module 22 switches the first camera 4 from a disabled state to the enabled state when the suction 2 is moved to the top of the first camera 4. The acquiring module 23 acquires the first image captured by the first camera 4. The calculating module 24 calculates a first angle a between the first image of the first element 3 and the first predetermined image. As shown in FIG. 4, the first element 3 is slantways sucked by the suction 2, the first camera 4 captures the first image of the first element 3. As shown in FIG. 5, the first angle a between the first image of the first element 3 and the first predetermined image is occurred. As shown in FIG. 6, if the position of the second element 8 is not adjusted, the first element 3 will be slantways placed on the second element 8. The control module 21 further controls the adjusting mechanism 9 to adjust the position of the second element 8 on the adjusting mechanism 9 based on the first angle a. As shown in FIG. 7, the position of the second element 8 has been adjusted based on the first angle a. The control module 21 further controls the mechanism arm 1 and the second camera 11 to move to the top of the adjusting mechanism 9 after the position of the second element 8 has been completely adjusted. The switching module 22 switches the second camera 11 from a disabled stated to the enabled state when the second camera 11 is moved to the top of the adjusting mechanism 9. The acquiring module 23 further acquires the second image captured by the second camera 11. The calculating module 24 calculates a second angle b between the second image and a second predetermined image. As shown in FIG. 8, the second angle b between the second image of the second element 8 and the second predetermined image is occurred. The determining module 25 determines whether or not the first angle a is the same as the second angle b. The control module 21 further controls the adjusting mechanism 9 to adjust the position of the second element 8 on the adjusting mechanism 9 until that the first angle a is the same as the second angle b when the first angle a is not the same as the second angle b. As shown in FIG. 9, the first element 3 slantways sucked by the suction 2 is aligndly placed on the second element 8 after the position of the second element 8 is adjusted based the first angle a.

Furthermore, the position adjusting device 10 further includes a testing rod 6 fixed on the bottom plate. The second camera 11 further captures a third image of the testing rod 6 when the second camera 11 is in the enabled state. The control module 21 controls the mechanism arm 1 and the second camera 11 to move to the top of the testing rod 6 after the position of the second element 8 has been adjusted. The switching module 22 switches the second camera 11 from the disabled state to the enabled state when the second camera 11 is moved to the top of the testing rod 6. The acquiring module 23 acquires the third image captured by the second camera 11. The determining module 25 determines whether or not the third image is the same as a third predetermined image. The control module 21 shuts down the second camera 11 and controls the mechanism arm 1 and the second camera 11 to move to the top of the adjusting mechanism 9 when the third image is the same as the third predetermined image. The control module 21 further controls the mechanical arm 1 to adjust the position of the second camera 11 until that the third image is the same as a predetermined third image when the third image is not the same as the third predetermined image.

Figure 10:
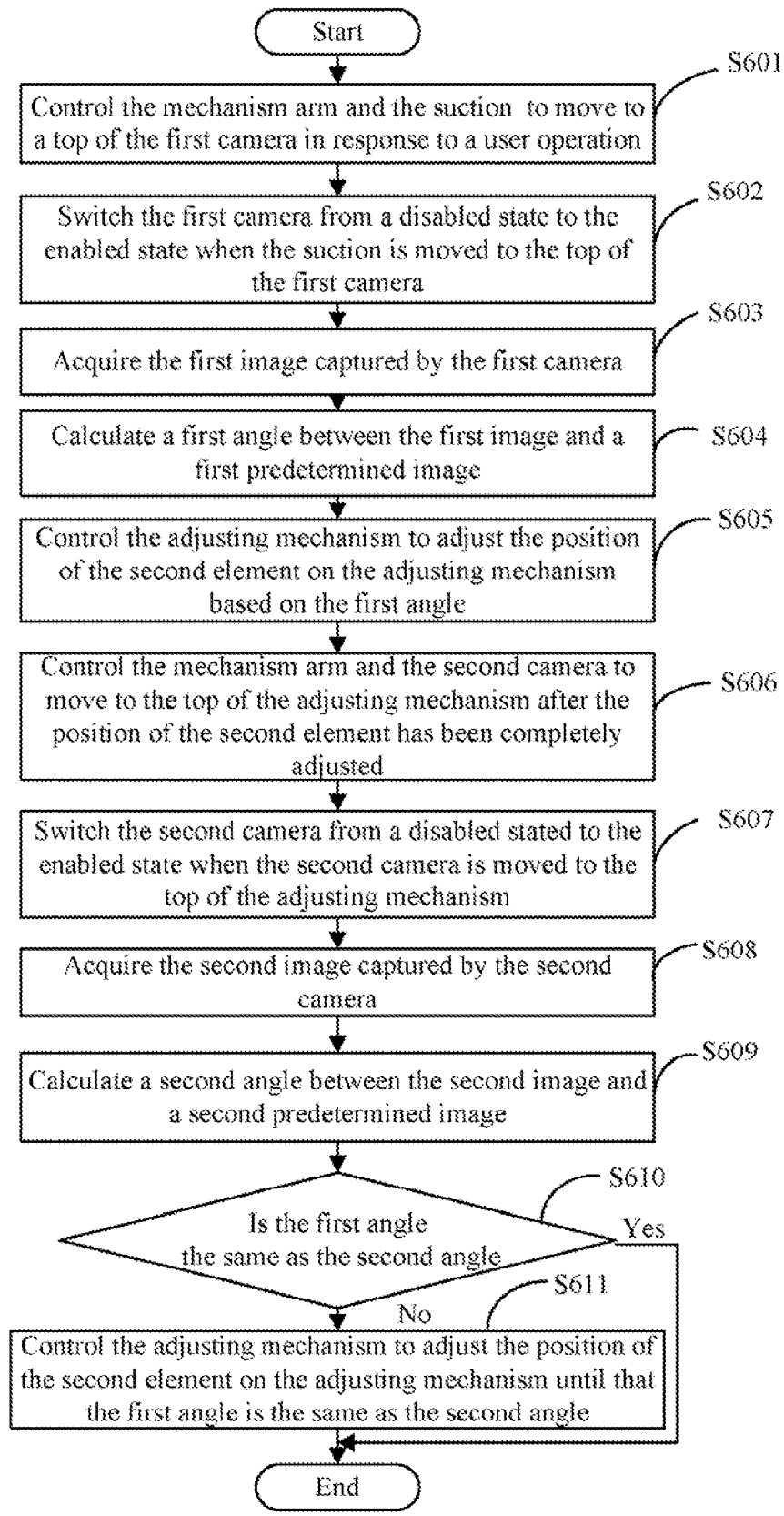
FIG. 10 is a flowchart of a position adjusting method implemented by the position adjusting system of FIG. 3.

FIG. 10 is a flowchart of a position adjusting method implemented by the position adjusting system of FIG. 3.

In step S601, the control module 21 controls the mechanism arm 1 and the suction 2 to move to a top of the first camera 4 in response to an operation.

In step S602, the switching module 22 switches the first camera 4 from a disabled state to the enabled state when the suction 2 is moved to the top of the first camera 4.

In step S603, the acquiring module 23 acquires the first image captured by the first camera 4.

In step S604, the calculating module 24 calculates a first angle a between the first image and the first predetermined image.

In step S605, the control module 21 further controls the adjusting mechanism 9 to adjust the position of the second element 8 on the adjusting mechanism 9 based on the first angle a.

In step S606, the control module 21 further controls the mechanism arm 1 and the second camera 11 to move to the top of the adjusting mechanism 9 after the position of the second element 8 has been completely adjusted.

In step S607, the switching module 22 switches the second camera 11 from a disabled stated to the enabled state when the second camera 11 is moved to the top of the adjusting mechanism 9.

In step S608, the acquiring module 23 further acquires the second image captured by the second camera 11.

In step S609, the calculating module 24 calculates a second angle b between the second image and a second predetermined image.

In step S610, the determining module 25 determines whether or not the first angle a is the same as the second angle b.

In step S611, the control module 21 further controls the adjusting mechanism 9 to adjust the position of the second element 8 on the adjusting mechanism 9 until that the first angle a is the same as the second angle b when the first angle a is not the same as the second angle b.

The method further includes sub-steps: the second camera 11 further captures a third image of the testing rod 6 when the second camera 11 is in the enabled state. The control module 21 controls the mechanism arm 1 and the second camera 11 to move to the top of the testing rod 6 after the position of the second element 8 has been completely adjusted. The switching module 22 switches the second camera 11 from the disabled state to the enabled state when the second camera 11 is moved to the top of the testing rod 6. The acquiring module 23 acquires the third image captured by the second camera 11. The determining module 25 determines whether or not the third image is the same as a third predetermined image. The control module 21 shuts down the second camera 11 and controls the mechanism arm 1 and the second camera 11 to move to the top of the adjusting mechanism 9 when the third image is the same as the third predetermined image. The control module 21 further controls the mechanical arm 1 to adjust the position of the second camera 11 until that the third image is the same as the third predetermined image when the third image is not the same as the third predetermined image.

Although various embodiments have been specifically described, the disclosure is not to be construed as being limited thereto. Various changes or modifications may be made to the embodiments without departing from the scope and spirit of the disclosure.

What is claimed is:

1. A position adjusting device comprising:
    a movable mechanical arm;
    a suction fixed on the mechanical arm, and configured to suck a first element;
    an adjusting mechanism placed below the movable mechanism arm, and configured to support a second element;
    a bottom plate placed below the movable mechanism arm;
    a first camera fixed on the bottom plate, and configured to capture a first image of the first element when the first camera is in an enabled state;
    a second camera fixed on the movable mechanical arm, and configured to capture a second image of the second element when the second camera is in an enabled state; and
    a processor configured to control the movable mechanism arm and the suction to move to a top of the first camera in response to a user operation, switch the first camera from a disabled state to the enabled state when the suction is moved to the top of the first camera, acquire the first image captured by the first camera, calculate a first angle between the first image and a first predetermined image, control the adjusting mechanism to adjust the position of the second element on the adjusting mechanism based on the first angle, control the movable mechanism arm and the second camera to move to the top of the adjusting mechanism after the position of the second element has been completely adjusted, switch the second camera from a disabled stated to the enabled state when the second camera is moved to the top of the adjusting mechanism, acquire the second image captured by the second camera, calculate a second angle between the second image and a second predetermined image, determine whether or not the first angle is the same as the second angle, and control the adjusting mechanism to adjust the position of the second element on the adjusting mechanism until that the first angle is the same as the second angle when the first angle is not the same as the second angle.

2. The position adjusting device as described in claim 1, further comprising:
    a testing rod fixed on the bottom plate;
    the second camera further configured to capture a third image of the testing rod when the second camera is in the enabled state; and
    the processor further configured to control the mechanism arm and the second camera to move to the top of the testing rod after the position of the second element has been completely adjusted, switch the second camera from the disabled state to the enabled state when the second camera is moved to the top of the testing rod, acquire the third image captured by the second camera, determine whether or not the third image is the same as a predetermined third image, shut down the second camera and control the mechanism arm and the second camera to move to the top of the adjusting mechanism when the third image is the same as a third predetermined image.

3. The position adjusting device as described in claim 2, wherein the processor is further configured to control the mechanical arm to adjust the position of the second camera until that the third image is the same as the third predetermined image when the third image is not the same as the third predetermined image.

4. A position adjusting system running in a position adjusting device, wherein the position adjusting device comprises a movable mechanical arm, a suction fixed on the mechanical arm, and configured to suck a first element, an adjusting mechanism placed below the movable mechanism arm, and configured to support a second element, a bottom plate placed below the movable mechanism arm, a first camera fixed on the bottom plate, and configured to capture a first image of the first element when the first camera is in an enabled state, a second camera fixed on the movable mechanical arm, and configured to capture a second image of the second element when the second camera is in an enabled state, the position adjusting system comprising:

at least one processor; and a plurality of modules executed by the at least one processor, wherein the plurality of modules comprises:

a control module configured to control the mechanism arm and the suction to move to a top of the first camera in response to a user operation;

a switching module configured to switch the first camera from a disabled state to the enabled state when the suction is moved to the top of the first camera;

an acquiring module configured to acquire the first image captured by the first camera;

a calculating module configured to calculate a first angle between the first image between a first predetermined image;

the control module further configured to control the adjusting mechanism to adjust the position of the second element on the adjusting mechanism based on the first angle;

the control module further configured to control the mechanism arm and the second camera to move to the top of the adjusting mechanism after the position of the second element has been completely adjusted;

the switching module further configured to switch the second camera from a disabled stated to the enabled state when the second camera is moved to the top of the adjusting mechanism;

the acquiring module further configured to acquire the second image captured by the second camera;

the calculating module further configured to calculate a second angle between the second image and a second predetermined image;

a determining module configured to determine whether or not the first angle is the same as the second angle; and the control module further configured to control the adjusting mechanism to adjust the position of the second element on the adjusting mechanism until that the first angle is the same as the second angle when the first angle is not the same as the second angle.

5. The position adjusting system as described in claim 4, wherein the position adjusting device further comprises a testing rod fixed on the bottom plate, the second camera is configured to capture a third image of the testing rod when the second camera is in the enabled state;

the control module further configured to control the mechanism arm and the second camera to move to the top of the testing rod after the position of the second element has been completely adjusted;

the switching module further configured to switch the second camera from the disabled state to the enabled state when the second camera is moved to the top of the testing rod;

the acquiring module further configured to acquire the third image captured by the second camera;

the determining module further configured to determine whether or not the third image is the same as a third predetermined image; and the control module further configured to shut down the second camera and control the mechanism arm and the second camera to move to the top of the adjusting mechanism when the third image is the same as the third predetermined image.

6. The position adjusting system as described in claim 5, wherein the control module is further configured to control the mechanical arm to adjust the position of the second camera until that the third image is the same as the third predetermined image when the third image is not the same as the third predetermined image.

7. A position adjusting method running in a position adjusting device, wherein the position adjusting device comprises a movable mechanical arm, a suction fixed on the mechanical arm, and configured to suck a first element, an adjusting mechanism placed below the movable mechanism arm, and configured to support a second element, a bottom plate placed below the movable mechanism arm, a first camera fixed on the bottom plate, and configured to capture a first image of the first element when the first camera is in an enabled state, a second camera fixed on the movable mechanical arm, and configured to capture a second image of the second element when the second camera is in an enabled state, the position adjusting method comprising:

controlling the mechanism arm and the suction to move to a top of the first camera in response to a user operation;

switching the first camera from a disabled state to the enabled state when the suction is moved to the top of the first camera;

acquiring the first image captured by the first camera;

calculating a first angle between the first image between a first predetermined image;

controlling the adjusting mechanism to adjust the position of the second element on the adjusting mechanism based on the first angle;

controlling the mechanism arm and the second camera to move to the top of the adjusting mechanism after the position of the second element has been completely adjusted;

switching the second camera from a disabled stated to the enabled state when the second camera is moved to the top of the adjusting mechanism;

acquiring the second image captured by the second camera;

calculating a second angle between the second image and a second predetermined image;

determining whether or not the first angle is the same as the second angle; and controlling the adjusting mechanism to adjust the position of the second element on the adjusting mechanism until that the first angle is the same as the second angle when the first angle is not the same as the second angle.

8. The position adjusting method as described in claim 7, wherein the position adjusting device further comprises a testing rod fixed on the bottom plate, the second camera is configured to capture a third image of the testing rod when the second camera is in the enabled state, the method further comprising:

controlling the mechanism arm and the second camera to move to the top of the testing rod after the position of the second element has been completely adjusted;

switching the second camera from the disabled state to the enabled state when the second camera is moved to the top of the testing rod;

acquiring the third image captured by the second camera;

determining whether or not the third image is the same as a third predetermined image; and shutting down the second camera and controlling the mechanism arm and the second camera to move to the top of the adjusting mechanism when the third image is the same as the third predetermined image.

9. The position adjusting method as described in claim 8, further comprising:

controlling the mechanical arm to adjust the position of the second camera until that the third image is the same as the third predetermined image when the third image is not the same as the third predetermined image.

* * * * *